(12) United States Patent
Tanimoto

(10) Patent No.: US 9,972,710 B2
(45) Date of Patent: May 15, 2018

(54) FIELD EFFECT TRANSISTOR

(71) Applicant: NICHIA CORPORATION, Anan-shi (JP)

(72) Inventor: Masashi Tanimoto, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days. days.

(21) Appl. No.: 15/381,108

(22) Filed: Dec. 16, 2016

(65) Prior Publication Data

US 2017/0179270 A1    Jun. 22, 2017

(30) Foreign Application Priority Data

Dec. 17, 2015 (JP) ................................ 2015-245741
Sep. 15, 2016 (JP) ................................ 2016-180063

(51) Int. Cl.

| H01L 29/778 | (2006.01) |
|---|---|
| H01L 29/205 | (2006.01) |
| H01L 29/66 | (2006.01) |
| H01L 29/06 | (2006.01) |

(Continued)

(52) U.S. Cl.

CPC ...... *H01L 29/7786* (2013.01); *H01L 29/0611* (2013.01); *H01L 29/1029* (2013.01); *H01L 29/205* (2013.01); *H01L 29/66431* (2013.01); *H01L 29/66462* (2013.01); *H01L 29/778* (2013.01); *H01L 29/1033* (2013.01); *H01L 29/66469* (2013.01); *H01L 29/7787* (2013.01); *H01L 29/78696* (2013.01); *H01L 2924/13064* (2013.01)

(58) Field of Classification Search

CPC ................................................ H01L 29/66469
USPC ................................................ 257/240, 241
See application file for complete search history.

(56) References Cited

U.S. PATENT DOCUMENTS 7,601,993 B2    10/2009  Hoshi et al.
8,242,539 B2     8/2012  Ohmaki
(Continued)

FOREIGN PATENT DOCUMENTS

| JP | 04-280438 | 10/1992 |
|---|---|---|
| JP | 2005-252083 | 9/2005 |

(Continued)

*Primary Examiner* — Phat X Cao
*Assistant Examiner* — Diana C Vieira
(74) *Attorney, Agent, or Firm* — Mori & Ward, LLP

(57) ABSTRACT

A field effect transistor includes a semiconductor stack including a channel provided on a border between a first nitride semiconductor and a second nitride semiconductor provided on the first nitride semiconductor in a stacking direction. A source electrode, a gate electrode, and a drain electrode are disposed on the semiconductor stack. The gate electrode is disposed between the source electrode and the drain electrode. At least one hole is provided to pass through the channel from the first nitride semiconductor to the second nitride semiconductor to provide channel paths from the gate electrode to the drain electrode. A minimum distance of the channel paths is longer than a minimum distance between the gate electrode and drain electrode viewed in the stacking direction. The insulating member is filled in the at least one hole and has a breakdown field strength higher than a breakdown field strength of the semiconductor stack.

16 Claims, 5 Drawing Sheets

(51) Int. Cl.
*H01L 29/10* (2006.01)
*H01L 29/786* (2006.01)

(56) References Cited

U.S. PATENT DOCUMENTS

| | | | |
|---|---|---|---|
| 8,564,020 B2 * | 10/2013 | Chen | H01L 21/28575 257/194 |
| 2007/0090470 A1 | 4/2007 | Heringa | |
| 2007/0132037 A1 | 6/2007 | Hoshi et al. | |
| 2007/0272945 A1 | 11/2007 | Matsuo et al. | |
| 2008/0173898 A1 | 7/2008 | Ohmaki | |
| 2013/0134435 A1 * | 5/2013 | Yu | H01L 29/42316 257/76 |
| 2014/0339650 A1 * | 11/2014 | Smith | H01L 29/1033 257/409 |
| 2015/0155273 A1 | 6/2015 | Nakajima et al. | |
| 2017/0221998 A1 | 8/2017 | Ebihara et al. | |

FOREIGN PATENT DOCUMENTS

| | | |
|---|---|---|
| JP | 2006-253559 | 9/2006 |
| JP | 2007-503128 | 2/2007 |
| JP | 2007-165446 | 6/2007 |
| JP | 2007-311733 | 11/2007 |
| WO | WO2013190997 | 12/2013 |
| WO | WO2015/166608 | 11/2015 |

\* cited by examiner

FIELD EFFECT TRANSISTOR

CROSS-REFERENCE TO RELATED APPLICATIONS

The present application claims priority under 35 U.S.C. § 119 to Japanese Patent Application No. 2015-245741, filed Dec. 17, 2015, and Japanese Patent Application No. 2016-180063, filed Sep. 15, 2016. The contents of these applications are incorporated herein by reference in their entirety.

BACKGROUND OF THE INVENTION

Field of the Invention

The present invention relates to a field effect transistor.

Discussion of the Background

Japanese Unexamined Patent Application Publication Nos. H04-280438, 2006-253559, and 2007-165446 disclose known field effect transistors. Such field effect transistors include a semiconductor layer including a channel, and a source electrode, a drain electrode, and a gate electrode disposed on the semiconductor layer. Japanese Unexamined Patent Application Publication Nos. H04-280438, 2006-253559, and 2007-165446 propose a structure that an insulating region or a recess portion is formed in the semiconductor layer for a variety of purposes. In Japanese Unexamined Patent Application Publication No. H04-280438, the insulating region is formed in the semiconductor layer for realizing a fine-structured channel. In Japanese Unexamined Patent Application Publication Nos. 2006-253559 and 2007-165446, the recess portion is formed in the semiconductor layer for increasing a contact area with the electrodes.

SUMMARY OF THE INVENTION

According to one aspect of the present invention, a field effect transistor includes an insulating substrate, a semiconductor stack, a source electrode, a drain electrode, a gate electrode, at least one hole, and an insulating member. The semiconductor stack includes a first nitride semiconductor, a second nitride semiconductor, and a channel. The second nitride semiconductor is provided on the first nitride semiconductor in a stacking direction so that the first nitride semiconductor is sandwiched between the second nitride semiconductor and the insulating substrate. The channel is provided on a border between the first nitride semiconductor and the second nitride semiconductor. The source electrode and the drain electrode are disposed on the semiconductor stack. The gate electrode is disposed on the semiconductor stack between the source electrode and the drain electrode. The at least one hole is provided in the channel between the gate electrode and the drain electrode to pass through the channel from the first nitride semiconductor to the second nitride semiconductor to provide channel paths from the gate electrode to the drain electrode in the channel. A minimum distance of the channel paths is longer than a minimum distance between the gate electrode and the drain electrode viewed in the stacking direction. The insulating member is filled in the at least one hole and has a breakdown field strength higher than a breakdown field strength of the semiconductor stack.

According to another aspect of the present invention, a field effect transistor includes an insulating substrate, a semiconductor stack, a source electrode, a drain electrode, a gate electrode, at least one hole, and an insulating member. The semiconductor stack includes a first nitride semiconductor, a second nitride semiconductor, and a channel. The second nitride semiconductor is provided on the first nitride semiconductor in a stacking direction so that the first nitride semiconductor is sandwiched between the second nitride semiconductor and the insulating substrate. The channel is provided on a border between the first nitride semiconductor and the second nitride semiconductor. The source electrode and the drain electrode are disposed on the semiconductor stack. The gate electrode is disposed on the semiconductor stack between the source electrode and the drain electrode. The at least one hole is provided in the channel between the gate electrode and the drain electrode to pass through the channel from the first nitride semiconductor to the second nitride semiconductor to provide channel paths from the gate electrode to the drain electrode in the channel. A minimum distance of the channel paths is longer than a minimum distance between the gate electrode and the drain electrode viewed in the stacking direction. The insulating member is filled in the at least one hole and is formed of polyimide.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
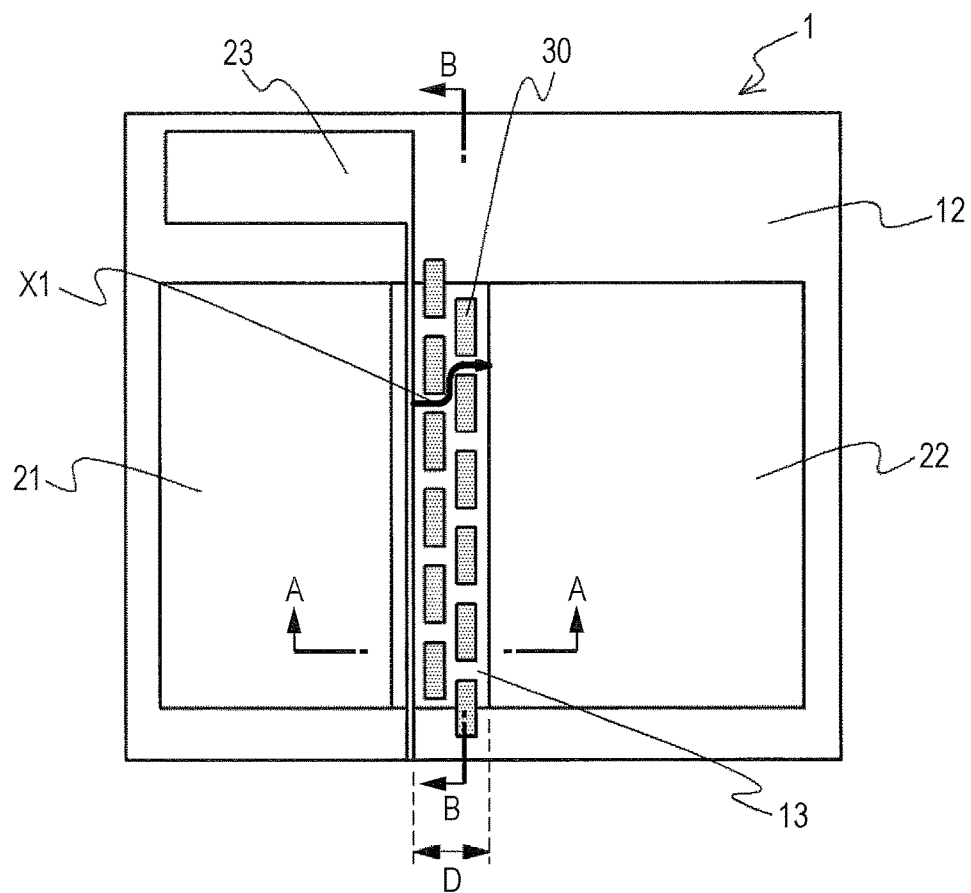
FIG. 1 is a schematic plan view of a field effect transistor according to a first embodiment.

The embodiments will now be described with reference to the accompanying drawings, wherein like reference numerals designate corresponding or identical elements throughout the various drawings.

First Embodiment

Figure 2:
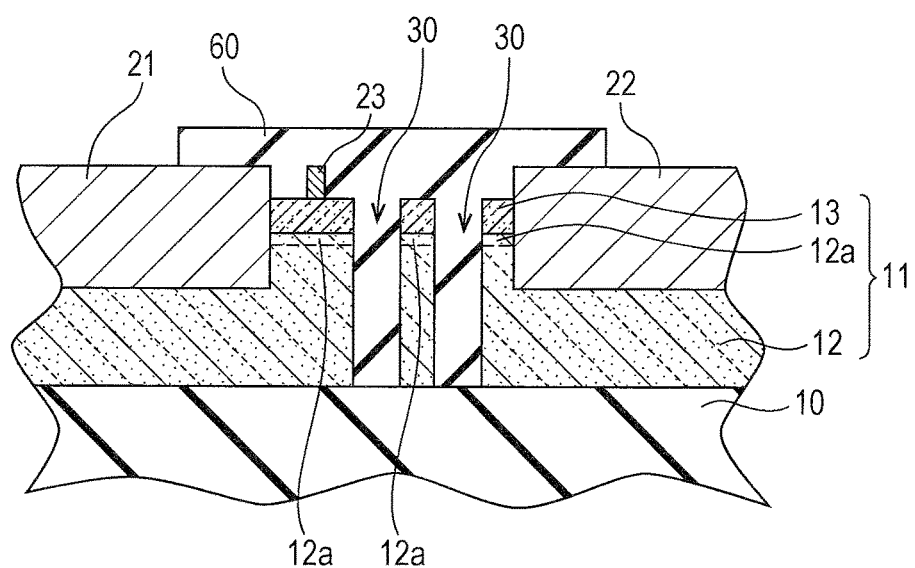
FIG. 2 is a schematic sectional view taken along line A-A in FIG. 1.
Figure 3:
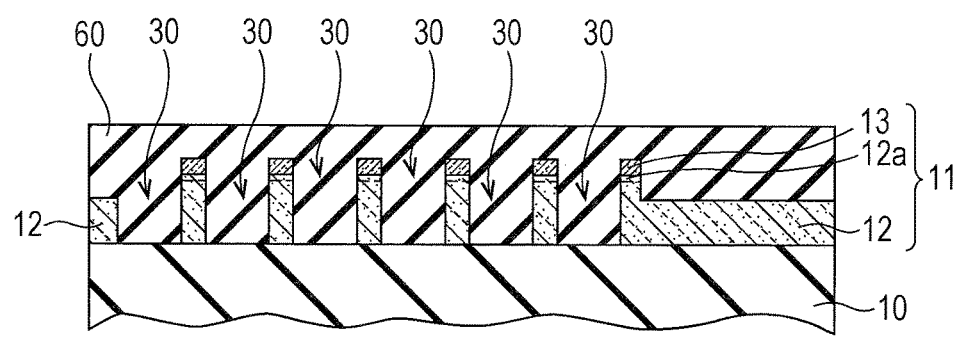
FIG. 3 is a schematic sectional view taken along line B-B in FIG. 1.

FIG. 1 is a schematic plan view of a field effect transistor according to a first embodiment. FIG. 2 is a schematic sectional view taken along line A-A in FIG. 1. FIG. 3 is a schematic sectional view taken along line B-B in FIG. 1. As illustrated in FIGS. 1 to 3, a field effect transistor 1 is, for example, a high electron mobility transistor (HEMT). The field effect transistor 1 includes a semiconductor stack 11, a gate electrode 23 disposed on the semiconductor stack 11, and a source electrode 21 and a drain electrode 22 disposed on the semiconductor stack with the gate electrode 23 interposed therebetween as seen in plan view. The semiconductor stack 11 is formed of a nitride semiconductor and includes a channel 12a. Further, the semiconductor stack 11 has a hole 30 formed to pass through the channel 12a between the gate electrode 23 and the drain electrode 22. The hole 30 is formed such that a minimum distance of a route X1 from the gate electrode 23 to the drain electrode 22 on the channel 12a (a channel path X1) becomes longer than a minimum distance D between the gate electrode 23 and drain electrode 22 as seen in plan view. The hole 30 is filled with an insulating member 60 larger in breakdown field strength than the semiconductor stack 11. In FIG. 1, the insulating member 60 is not illustrated, and the hole 30 is painted gray.

The hole 30 is formed to make the route X1 connecting the gate electrode 23 to the drain electrode 22 on the channel 12a longer than the minimum distance D between the gate electrode 23 and the drain electrode 22. In addition, the hole 30 is filled with the insulating member 60 larger in breakdown field strength than the semiconductor stack 11. The breakdown field strength of the semiconductor stack 11 typically refers to the breakdown field strength of a first semiconductor layer 12 (a first nitride semiconductor 12) in which the channel 12a is formed. For example, the breakdown field strength of the semiconductor stack 11 refers to the breakdown field strength of GaN. Diverting the route X1 on the channel 12a can increase a substantial channel length and reduce the electric field strength at the same voltage. This configuration can enhance the withstand voltage characteristics of the field effect transistor 1 and can shorten the distance between the gate electrode 23 and the drain electrode 22. The shortened distance between the gate electrode and the drain electrode can lead to a reduction in area of the field effect transistor 1. It is considered that the member in the hole 30, which is equal or lower in breakdown field strength to or than the semiconductor stack 11, inhibits the enhancement of the withstand voltage characteristics using the hole 30 for diverting the channel 12a. Therefore, the hole 30 is filled with the insulating member 60 with large breakdown field strength.

The field effect transistor 1 may further include an insulating substrate 10. The semiconductor stack 11 is disposed on the insulating substrate 10. The hole 30 preferably reaches the insulating substrate 10. If the semiconductor stack 11 is partly remained in a lower part of the hole 30, this remained part might serve as a current path. This case inhibits a satisfactory increase in the minimum distance on the channel. Accordingly, the hole 30 is preferably formed to reach the insulating substrate 10 so as not to form a current path in the lower part of the hole 30. Using one hole, further, it is difficult to make the minimum distance of the route X1 from the gate electrode 23 to the drain electrode 22 on the channel 12a longer than the minimum distance D between the gate electrode 23 and the drain electrode 22. Therefore, the semiconductor stack 11 preferably has a plurality of holes 30. In this case, all the holes 30 preferably reach the insulating substrate 10. Moreover, all the holes 30 are preferably filled with an insulating member with large breakdown field strength, such as polyimide.

As illustrated in FIG. 1, the holes 30 according to the present embodiment include a first group arranged along a direction crossing a direction of connecting the gate electrode 23 to the drain electrode 22 at the minimum distance, and a second group arranged between the first group and the drain electrode 22 along a direction substantially parallel to the direction in which the first group is arranged, as seen in plan view. The holes 30 in the first group and the holes 30 in the second group are arranged in a staggered form. More specifically, the holes 30 are arranged such that a straight line that extends from the gate electrode 23 to the drain electrode 22 through a clearance between two holes 30 in the first group reaches one of the holes 30 in the second group. In other words, in FIG. 1, the gate electrode 23 and the drain electrode 22 are disposed in parallel to each other, and the holes 30 are arranged to partially overlap each other in a direction perpendicular to the gate electrode 23 and the drain electrode 22. The holes 30 thus arranged can divert the route X1 on the channel 12a and make the route X1 longer than the minimum distance D between the gate electrode 23 and the drain electrode 22. Each of the holes 30 has a shape elongated in one direction as seen in plan view. The holes 30 can be formed by removing a part of the semiconductor stack 11 by, for example, reactive ion etching (RIE). It should be noted that the direction crossing the direction of connecting the gate electrode 23 to the drain electrode 22 at the minimum distance typically refers to a direction substantially perpendicular to the direction of connecting the gate electrode 23 to the drain electrode 22 at the minimum distance.

Next, a description will be given of each constituent member of the field effect transistor 1 according to the present embodiment.

Insulating Substrate 10

The insulating substrate 10 can be omitted. Preferably, the insulating substrate 10 is disposed under the semiconductor stack 11. The insulating substrate 10 is formed of, for example, sapphire.

Semiconductor Stack 11

The semiconductor stack 11 is formed of the nitride semiconductor. Examples of the nitride semiconductor include, but not limited thereto, GaN, InGaN, AlGaN, and AlN. The semiconductor stack 11 includes the first semiconductor layer 12 disposed on the insulating substrate 10, and a second semiconductor layer 13 (a second nitride semiconductor 13) disposed on the first semiconductor layer 12. The first semiconductor layer 12 is formed of, for example, GaN. The second semiconductor layer 13 is larger in band gap energy than the first semiconductor layer 12. The second semiconductor layer 13 is formed of, for example, AlGaN. The second semiconductor layer 13 may include an AlN layer that is thinner than the AlGaN layer and is disposed under the AlGaN layer. The channel 12a is formed near a surface of the first semiconductor layer 12, the surface being closer to the second semiconductor layer 13. The channel 12a is, for example, a two-dimensional electron gas layer. As illustrated in FIGS. 1 to 3, the channel 12a is preferably removed in a region other than a region between the source electrode 21 and the drain electrode 22. Since the region where the channel 12a remains acts as an active region, the holes 30 may be disposed in the active region so as to divert the route X1 on the channel 12a without fail. The holes 30 can be formed only inside the active region. As illustrated in FIG. 1, alternatively, the holes 30 on an end of the active region are preferably arranged to extend from the inside of the active region to the outside of the active region. This configuration can surely divert the route X1 on the channel even when a slight positional shift occurs in manufacturing.

Source Electrode 21

The source electrode 21 is formed of, for example, Ti and Al. As illustrated in FIG. 2, preferably, the source electrode 21 is disposed in a recess portion that is formed in the semiconductor stack 11 to reach the channel 12a. The source electrode 21 thus can be brought into contact with the channel 12a. In this case, an end, closer to the gate electrode 23, of the source electrode 21 may be placed on the second semiconductor layer 13.

Drain Electrode 22

The drain electrode 22 is formed of, for example, Ti and Al. As illustrated in FIG. 2, preferably, the drain electrode 22 is disposed in a recess portion formed in the semiconductor stack 11 to reach the channel 12a. The drain electrode 22 thus can be brought into contact with the channel 12a. In this case, an end, closer to the gate electrode 23, of the drain electrode 22 may be placed on the second semiconductor layer 13.

Gate Electrode 23

The gate electrode 23 is formed of a material to be appropriately selected from materials that can achieve a function of the gate electrode 23. The gate electrode 23 is formed of, for example, Ni/Au/Pt in this order from the semiconductor stack 11. A gate contact layer such as a p-type GaN layer may be disposed between the gate electrode 23 and the second semiconductor layer 13.

Insulating Member 60

The insulating member 60 is formed of a member with breakdown field strength larger than the breakdown field strength of the semiconductor stack 11 (for example, the breakdown field strength of GaN). The breakdown field strength of GaN has a theoretical limit value of 330 V/μm and an experimental value smaller than 200 V/μm based on, for example, a result in FIG. 4 to be described later. The insulating member 60 may be formed of polyimide or SiN larger in breakdown field strength than GaN. The breakdown field strength of polyimide is, for example, 420 V/μm. The breakdown field strength of SiN has a theoretical value of 1000 V/μm. The insulating member 60 may be filled in the holes 30 to such an extent that enhances the withstand voltage characteristics of the field effect transistor. The insulating member 60 is preferably formed of polyimide. Polyimide can be applied by spin coating, so that the holes 30 can be filled with polyimide in a shorter time than a case where a polyimide film is formed by, for example, sputtering. For example, polyimide is applied onto the entire upper surface of the semiconductor stack 11 including the holes 30 by spin coating, and a portion of polyimide on a region to which a wire or the like for each electrode is to be connected is removed by photolithography, followed by baking.

Experimental Example

Figure 4:
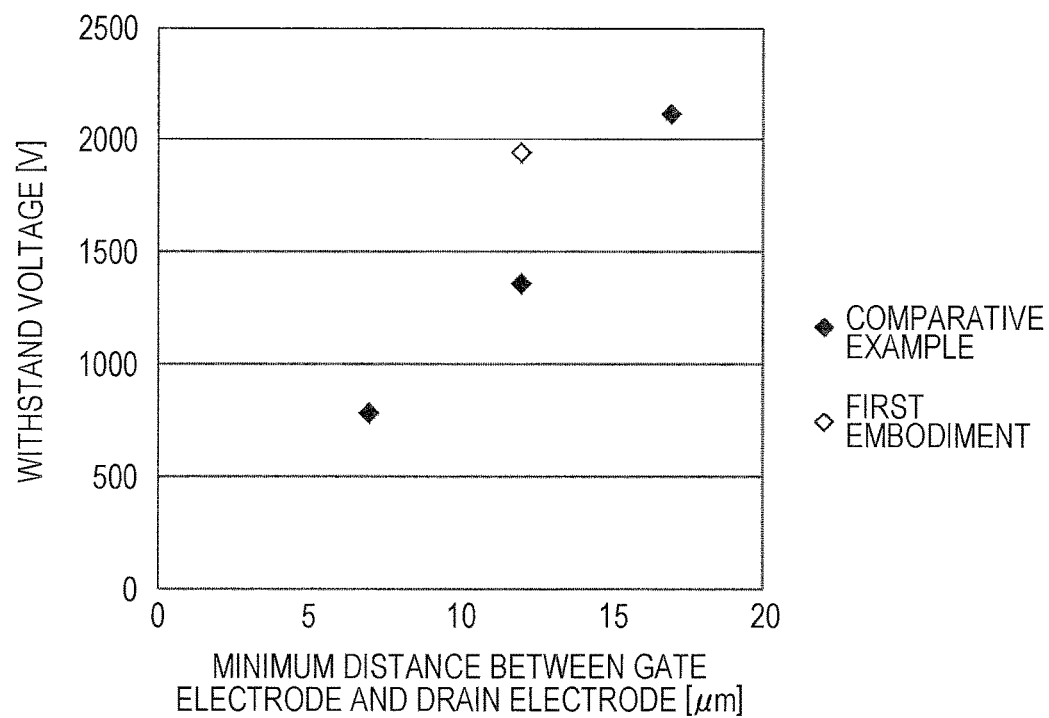
FIG. 4 is a graph illustrating a relationship between a withstand voltage and a distance between a gate electrode and a drain electrode, with regard to the field effect transistor of the first embodiment and a field effect transistor of a comparative example.

FIG. 4 illustrates a withstand voltage of a field effect transistor having a hole of the shape illustrated in FIG. 1 (hereinafter, referred to as a working example). FIG. 4 also illustrates a withstand voltage of a field effect transistor having no hole (hereinafter, referred to as a comparative example). The working example is indicated by a white square whereas the comparative example is indicated by a black square. In the working example, as seen in plan view, a minimum distance between a source electrode and a drain electrode is approximately 15 μm, and a minimum distance between a gate electrode and the drain electrode is approximately 12 μm. The working example is equal to the comparative example in a distance between the source electrode and the gate electrode. In the comparative example, a minimum distance between a gate electrode and a drain electrode is set at approximately 7 μm, approximately 12 μm, and approximately 17 μm. Also in the comparative example, a minimum distance between a source electrode and the drain electrode is set at approximately 10 μm, approximately 15 μm, and approximately 20 μm. Three field effect transistors were prepared for the respective distances. In each of the field effect transistors, a voltage was applied between the gate electrode and the drain electrode, and a voltage value at which insulation breakdown takes place between the electrodes was defined as a withstand voltage. More specifically, the voltage was gradually increased and the voltage that causes damage to the electrodes was defined as the voltage value at which the insulation breakdown takes place. In FIG. 4, average values of the withstand voltages in the respective distances are plotted. In FIG. 4, a longitudinal axis indicates the withstand voltage, and a lateral axis indicates the minimum distance between the gate electrode and the drain electrode.

As shown with the comparative example having no hole in FIG. 4, the withstand voltage rises as the distance between the gate electrode and the drain electrode increases (i.e., as the distance between the source electrode and the drain electrode increases). The working example, in which the minimum distance between the gate electrode and the drain electrode is approximately 12 μm, could achieve substantially the same withstand voltage as that of the comparative example in which minimum distance between the gate electrode and the drain electrode is approximately 17 μm. As described above, the working example can enhance the withstand voltage characteristics by reducing the increase in the minimum distance between the gate electrode and the drain electrode, in comparison with the comparative example.

Second Embodiment

Figure 5:
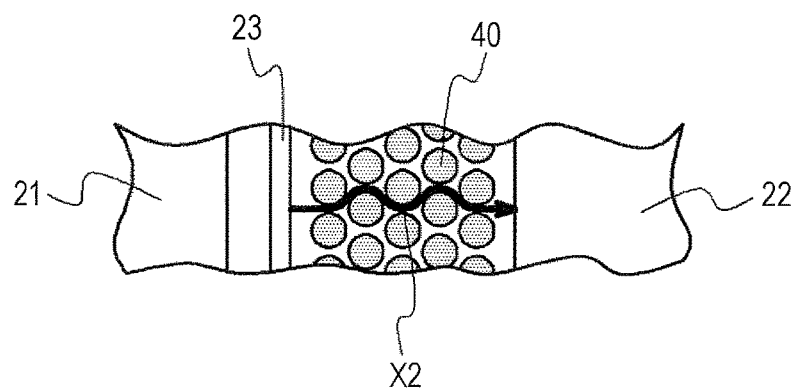
FIG. 5 is a schematic partially enlarged plan view of a field effect transistor according to a second embodiment.

FIG. 5 is a schematic partially enlarged plan view of a field effect transistor according to a second embodiment. In FIG. 5, a plurality of holes 40 are painted gray. The field effect transistor of the second embodiment is similar to the field effect transistor 1 of the first embodiment except a shape and an arrangement of the holes 40. The shape and the arrangement of the holes 40 define channel paths X2 (routes X2). Similar to the field effect transistor 1 of the first embodiment, the field effect transistor of the second embodiment can increase a withstand voltage and shorten a distance between a gate electrode 23 and a drain electrode 22. More specifically, with regard to the holes 40, plural sets of a pair of first and second groups described above are arranged in a direction of connecting the gate electrode 23 to the drain electrode 22 at a minimum distance. Further, each of the holes 40 has a circular shape as seen in plan view.

Third Embodiment

Figure 6:
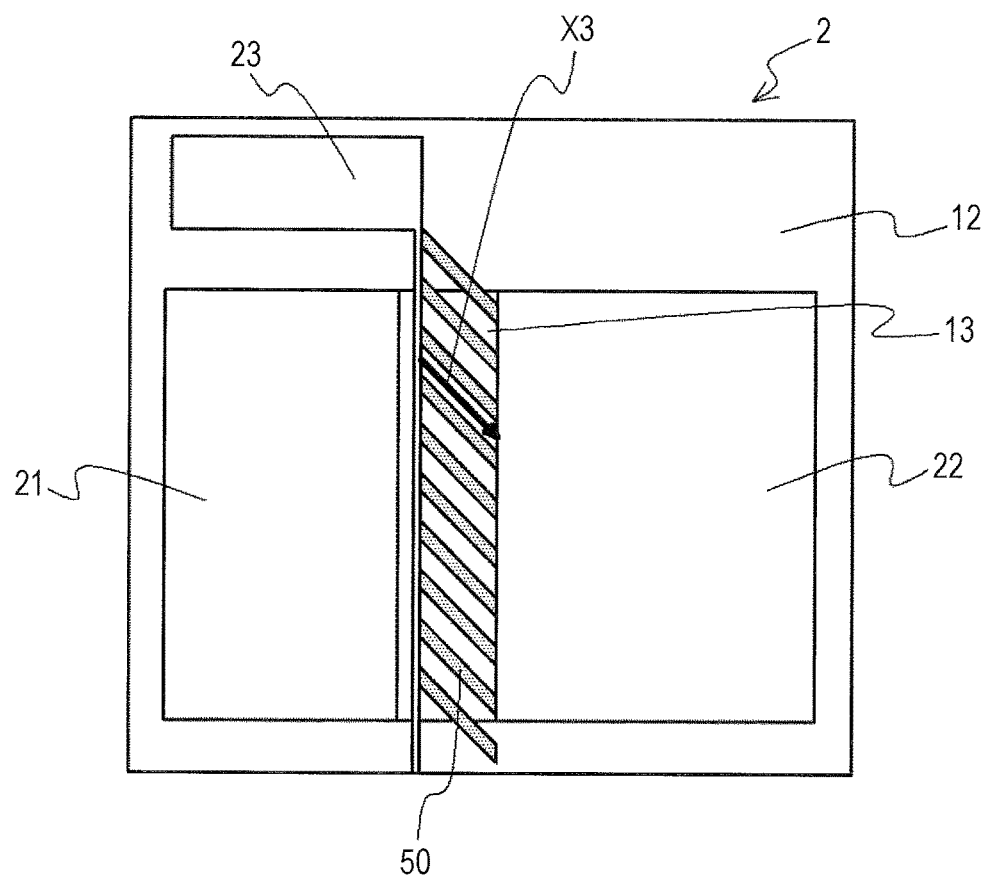
FIG. 6 is a schematic plan view of a field effect transistor according to a third embodiment.

FIG. 6 is a schematic plan view of a field effect transistor 2 according to a third embodiment. In FIG. 6, a plurality of holes 50 are painted gray. The field effect transistor 2 of the third embodiment is similar to the field effect transistor 1 of the first embodiment except a shape and an arrangement of the holes 50. The field effect transistor 2 of the third embodiment is also similar to the field effect transistor 1 of the first embodiment in the following respect. That is, a channel 12a is removed in a region other than a region between a source electrode 21 and a drain electrode 22, and the holes 50 on an end of an active region where the channel 12a remains are arranged to extend from the inside of the active region to the outside of the active region. Similar to the field effect transistor 1 of the first embodiment, the field effect transistor 2 of the third embodiment can increase a withstand voltage and shorten a distance between the gate electrode 23 and the drain electrode 22.

Each of the holes 50 has a shape extending in a direction crossing a direction of connecting the gate electrode 23 to the drain electrode 22 at a minimum distance as seen in plan view. The holes 50 define channel paths X3 (routes X3). The field effect transistor 2 having the holes 50 imposes a limitation to a width of the channel 12a in comparison with a field effect transistor having no holes, and therefore is susceptible to an increase in resistance. However, an aforementioned shape of the hole 50 can prevent the channel 12a from being locally narrow. It is therefore considered that the holes 50 increase an integral of the width of the channel 12a along one of the routes X3. Consequently, the holes 50 can reduce the increase in resistance. The holes 50 are arranged to cut across, without fail, a straight line of connecting the gate electrode 23 to the drain electrode 22 at the minimum distance. For example, assuming that a straight line extends in a direction of connecting an end, closer to the gate electrode 23, of one of holes 50 to the drain electrode 22 at a minimum distance, the holes 50 are arranged such that the straight line passes another one of the holes 50.

The holes 50 may be spaced apart from the gate electrode 23 and the drain electrode 22. Each of the holes 50 preferably has a shape connecting the gate electrode 23 to the drain electrode 22 as seen in plan view. In other words, each of the holes 50 preferably has one end connected to the gate electrode 23 and the other end connected to the drain electrode 22. It is considered that this configuration can prevent the channel 12a from being locally narrow, and thus can reduce the increase in resistance due to the holes 50.

Fourth Embodiment

Figure 7:
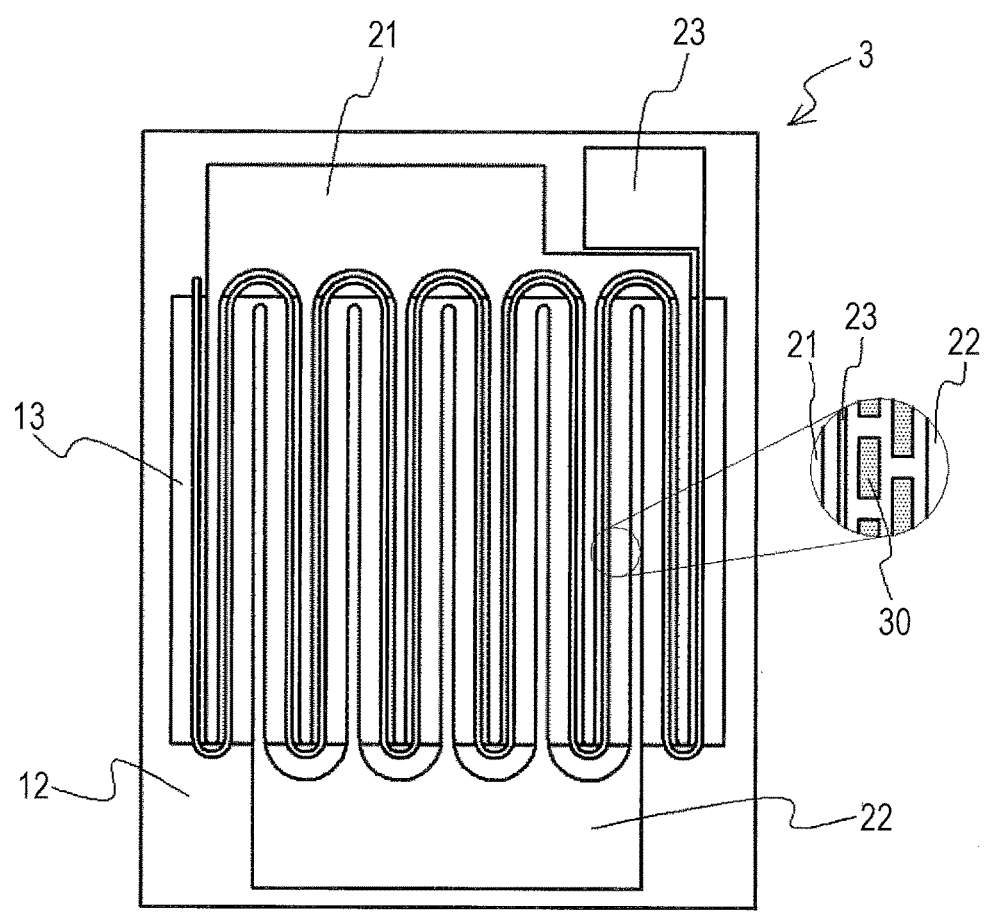
FIG. 7 is a schematic plan view of a field effect transistor according to a fourth embodiment.

FIG. 7 is a schematic plan view of a field effect transistor 3 according to a fourth embodiment. The field effect transistor 3 of the fourth embodiment is similar to the field effect transistor 1 of the first embodiment except shapes of a source electrode 21, a drain electrode 22, and a gate electrode 23. In the field effect transistor 3, the source electrode 21 and the drain electrode 22 each include a plurality of extending parts each extending in the same direction. The extending parts of the source electrode 21 and the extending parts of the drain electrode 22 are disposed alternately. The gate electrode 23 is disposed between the source electrode 21 and the drain electrode 22 in a region where a second semiconductor layer 13 is located. As illustrated in a partially enlarged view in FIG. 7, similar to the field effect transistor 1 of the first embodiment, in the field effect transistor 3, a semiconductor stack 11 has a plurality of holes 30 formed to pass through a channel between the gate electrode 23 and the drain electrode 22. The holes 30 are painted gray in FIG. 7.

Similar to the field effect transistor 1 of the first embodiment, the field effect transistor 3 can increase the withstand voltage. In the field effect transistor 3 including the gate electrode 23 and the drain electrode 22 formed in a comb shape, it is considered that the distance between the gate electrode 23 and the drain electrode 22 can be easily shortened by forming the holes 30, rather than by simply increasing the distance between the gate electrode 23 and the drain electrode 22. The shape and the like of the holes 30 are not limited to those illustrated in FIG. 7, and may have the various shapes and the like described with regard to the holes 30, 40, and 50 in the foregoing embodiments.

Obviously, numerous modifications and variations of the present invention are possible in light of the above teachings. It is therefore to be understood that within the scope of the appended claims, the invention may be practiced otherwise than as specifically described herein.

What is claimed is:

1. A field effect transistor comprising:
an insulating substrate;
a semiconductor stack comprising:
a first nitride semiconductor;
a second nitride semiconductor provided on the first nitride semiconductor in a stacking direction so that the first nitride semiconductor is sandwiched between the second nitride semiconductor and the insulating substrate; and
a channel provided on a border between the first nitride semiconductor and the second nitride semiconductor;
a source electrode and a drain electrode disposed on the semiconductor stack;
a gate electrode disposed on the semiconductor stack between the source electrode and the drain electrode;
at least one hole provided in the channel between the gate electrode and the drain electrode to pass through the channel from the first nitride semiconductor to the second nitride semiconductor to provide channel paths from the gate electrode to the drain electrode in the channel, a minimum distance of the channel paths being longer than a minimum distance between the gate electrode and the drain electrode viewed in the stacking direction, the at least one hole reaching the insulating substrate; and
an insulating member filled in the at least one hole and having a breakdown field strength higher than a breakdown field strength of the semiconductor stack.

2. The field effect transistor according to claim 1, wherein the at least one hole includes a plurality of holes.

3. The field effect transistor according to claim 2, wherein each of the plurality of holes extends in a direction crossing a direction of connecting the gate electrode to the drain electrode at the minimum distance viewed in the stacking direction.

4. The field effect transistor according to claim 1, wherein the insulating member is formed of polyimide.

5. The field effect transistor according to claim 1, wherein the insulating substrate includes sapphire.

6. The field effect transistor according to claim 1, wherein the first nitride semiconductor includes GaN.

7. The field effect transistor according to claim 6, wherein the second nitride semiconductor includes AlGaN.

8. A field effect transistor comprising:
an insulating substrate;
a semiconductor stack comprising:
a first nitride semiconductor;
a second nitride semiconductor provided on the first nitride semiconductor in a stacking direction so that the first nitride semiconductor is sandwiched between the second nitride semiconductor and the insulating substrate; and
a channel provided on a border between the first nitride semiconductor and the second nitride semiconductor;
a source electrode and a drain electrode disposed on the semiconductor stack;
a gate electrode disposed on the semiconductor stack between the source electrode and the drain electrode;
a plurality of holes provided in the channel between the gate electrode and the drain electrode to pass through the channel from the first nitride semiconductor to the second nitride semiconductor to provide channel paths from the gate electrode to the drain electrode in the channel, a minimum distance of the channel paths being longer than a minimum distance between the gate electrode and the drain electrode viewed in the stacking direction, each of the plurality of holes extending in a direction crossing a direction of connecting the gate electrode to the drain electrode at the minimum distance viewed in the stacking direction, at least one of the plurality of holes extending from the gate electrode to the drain electrode viewed in the stacking direction; and an insulating member filled in the at least one hole and having a breakdown field strength higher than a breakdown field strength of the semiconductor stack.

9. The field effect transistor according to claim 8, wherein the insulating substrate includes sapphire.

10. The field effect transistor according to claim 8, wherein the first nitride semiconductor includes GaN.

11. The field effect transistor according to claim 10, wherein the second nitride semiconductor includes AlGaN.

12. A field effect transistor comprising:
an insulating substrate;
a semiconductor stack comprising:
a first nitride semiconductor;
a second nitride semiconductor provided on the first nitride semiconductor in a stacking direction so that the first nitride semiconductor is sandwiched between the second nitride semiconductor and the insulating substrate; and
a channel provided on a border between the first nitride semiconductor and the second nitride semiconductor;

a source electrode and a drain electrode disposed on the semiconductor stack;
a gate electrode disposed on the semiconductor stack between the source electrode and the drain electrode;
at least one hole provided in the channel between the gate electrode and the drain electrode to pass through the channel from the first nitride semiconductor to the second nitride semiconductor to provide channel paths from the gate electrode to the drain electrode in the channel, a minimum distance of the channel paths being longer than a minimum distance between the gate electrode and the drain electrode viewed in the stacking direction, the at least one hole reaching the insulating substrate; and
an insulating member filled in the at least one hole and being formed of polyimide.

13. The field effect transistor according to claim 12, wherein the at least one hole includes a plurality of holes.

14. The field effect transistor according to claim 12, wherein the insulating substrate includes sapphire.

15. The field effect transistor according to claim 12, wherein the first nitride semiconductor includes GaN.

16. The field effect transistor according to claim 15, wherein the second nitride semiconductor includes AlGaN.

* * * * *